United States Patent
Kataoka et al.

(10) Patent No.: US 12,230,504 B2
(45) Date of Patent: Feb. 18, 2025

(54) PLASMA ETCHING METHOD AND PLASMA ETCHING APPARATUS

(71) Applicant: Kioxia Corporation, Tokyo (JP)

(72) Inventors: Junji Kataoka, Kawasaki (JP); Shuichi Kuboi, Yokohama (JP)

(73) Assignee: Kioxia Corporation, Tokyo (JP)

( * ) Notice: Subject to any disclaimer, the term of this patent is extended or adjusted under 35 U.S.C. 154(b) by 545 days.

(21) Appl. No.: 17/411,475

(22) Filed: Aug. 25, 2021

(65) Prior Publication Data

US 2022/0223430 A1 Jul. 14, 2022

(30) Foreign Application Priority Data

Jan. 12, 2021 (JP) .................. 2021-002664

(51) Int. Cl.
*H01L 21/311* (2006.01)
*H01J 37/32* (2006.01)
*H01L 21/3065* (2006.01)

(52) U.S. Cl.
CPC .. *H01L 21/31116* (2013.01); *H01J 37/32082* (2013.01); *H01J 37/32449* (2013.01); *H01J 37/32568* (2013.01); *H01L 21/3065* (2013.01); *H01L 21/31144* (2013.01); *H01J 2237/334* (2013.01)

(58) Field of Classification Search
CPC ........... H01L 21/31116; H01L 21/3065; H01L 21/31144; H01J 37/32082; H01J 37/32449; H01J 37/32568; H01J 2237/334
USPC ........................................... 216/67; 438/723
See application file for complete search history.

(56) References Cited

U.S. PATENT DOCUMENTS

| | | | |
|---|---|---|---|
| 5,366,590 A | 11/1994 | Kadomura | |
| 7,794,616 B2 | 9/2010 | Honda et al. | |
| 10,629,447 B2 | 4/2020 | Matsuura | |
| 11,046,629 B2 | 6/2021 | Kashikura et al. | |
| 2014/0077126 A1* | 3/2014 | Benson | C09K 13/00 252/79.1 |
| 2019/0013209 A1 | 1/2019 | Bruce et al. | |
| 2019/0198337 A1 | 6/2019 | Shigetoshi et al. | |
| 2020/0105908 A1* | 4/2020 | Tsai | H01L 21/32137 |
| 2020/0234962 A1 | 7/2020 | Kato et al. | |

(Continued)

FOREIGN PATENT DOCUMENTS

| | | |
|---|---|---|
| JP | 9-148314 A | 6/1997 |
| JP | 2014-41849 A | 3/2014 |
| JP | 2016-51777 A | 4/2016 |

(Continued)

OTHER PUBLICATIONS

Office Action issued May 28, 2024, in corresponding Japanese Patent Application No. 2021-002664 (with English Translation), 4 pages.

*Primary Examiner* — Duy Vu N Deo
(74) *Attorney, Agent, or Firm* — Oblon, McClelland, Maier & Neustadt, L.L.P.

(57) ABSTRACT

A plasma etching method in an embodiment includes etching a silicon-containing film by using plasma of a hydrofluorocarbon gas. The hydrofluorocarbon gas contains, as a conjugated cyclic compound, hydrofluorocarbon having a composition represented by $C_xH_yF_z$, where x, y, and z are positive integers satisfying $x \geq 6$ and $(z-y)/x \leq 1$.

18 Claims, 4 Drawing Sheets

(56) References Cited

U.S. PATENT DOCUMENTS

2021/0193475 A1 6/2021 Ishino et al.
2022/0223431 A1* 7/2022 Guo .................. H01L 21/31116

FOREIGN PATENT DOCUMENTS

| JP | 2017-50413 A | 3/2017 |
| WO | WO 2019/151467 A1 | 8/2019 |
| WO | WO 2020/054200 A1 | 3/2020 |

* cited by examiner

[C₆HF₅]

[C₇HF₇]

[C₇H₂F₆]

[C₇H₃F₅]

[C₈HF₉]

[C₈HF₇]

[C₉HF₉]

[C₉H₂F₈]

PLASMA ETCHING METHOD AND PLASMA ETCHING APPARATUS

CROSS REFERENCE TO RELATED APPLICATION

This application is based upon and claims the benefit of priority from Japanese Patent Application No. 2021-002664, filed on Jan. 12, 2021; the entire contents of which are incorporated herein by reference.

FIELD

Embodiments of the present invention relate to a plasma etching method and a plasma etching apparatus.

BACKGROUND

In the manufacturing process of a semiconductor device, plasma etching is performed in order to form a contact hole, a via hole, a trench (groove), and so on in a silicon-containing film such as a silicon oxide film formed on a semiconductor substrate, or the like. In the manufacturing process of the semiconductor device as above, precise control of a processing shape, particularly, vertical processing of a side wall of the contact hole or the like is important to ensure electrical performance or the like of the semiconductor device. For example, a recent three-dimensional structure device has a hole with a large aspect ratio. In order to form such a hole with a large aspect ratio by plasma etching, increasing a processing selection ratio between a film to be processed and an etching mask is desired.

DETAILED DESCRIPTION

Figure 1:
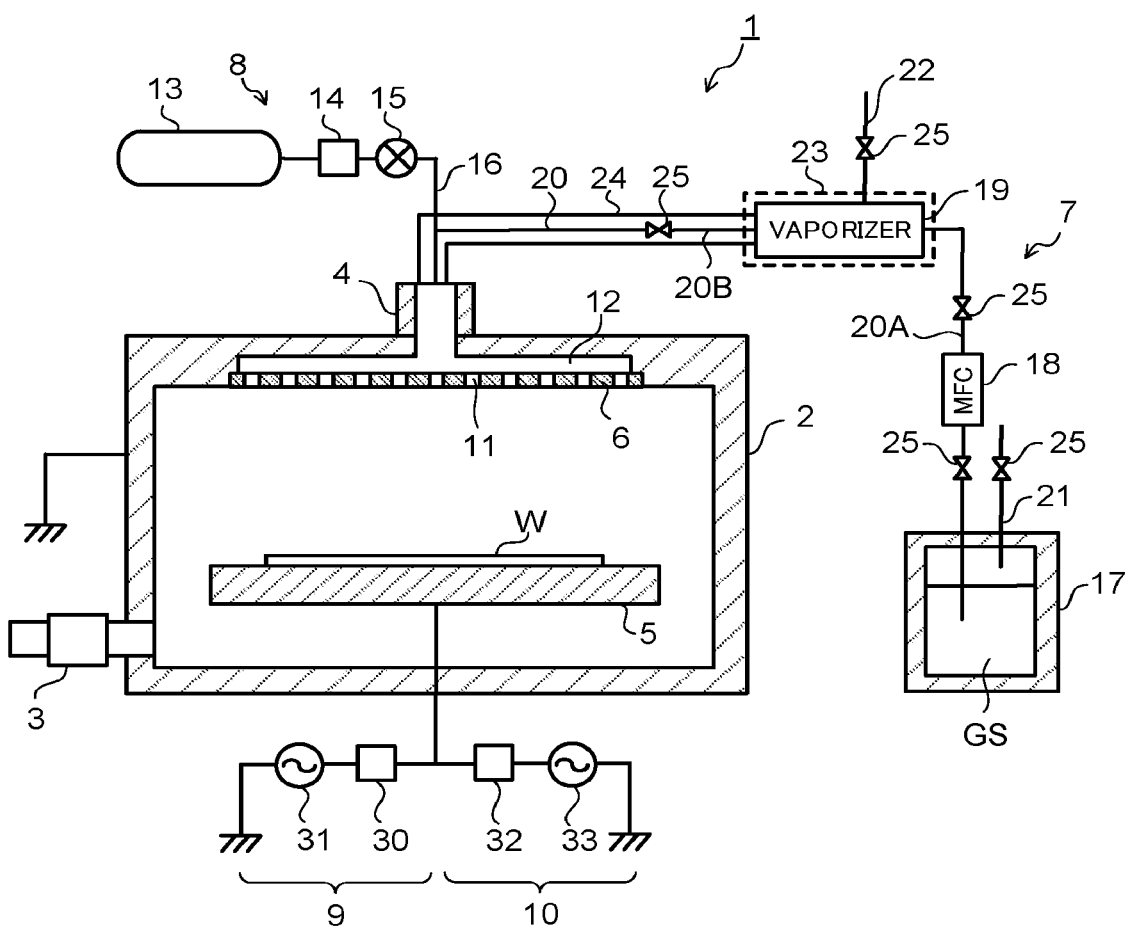
FIG. 1 is a cross-sectional view illustrating a plasma etching apparatus in an embodiment.

A plasma etching method in an embodiment includes etching a silicon-containing film by using plasma of a hydrofluorocarbon gas. The hydrofluorocarbon gas contains, as a conjugated cyclic compound, hydrofluorocarbon having a composition represented by $C_xH_yF_z$ (where x, y, and z are positive integers satisfying $x \geq 6$ and $(z-y)/x \leq 1$).

Hereinafter, there will be explained a plasma etching method and a plasma etching apparatus in embodiments while referring to the drawings. In each of the embodiments, substantially the same constituent portions will be denoted by the same reference numerals and explanation thereof is sometimes partially omitted. The drawings are schematic, and a relation between a thickness and a planer dimension, a thickness ratio of the respective parts, and so on may be different from actual ones. The term indicating a direction such as an upper or lower direction in the explanation indicates a relative direction when a later-described plasma etching surface (processing surface) of a substrate is faced upward, unless otherwise specified, and is sometimes different from an actual direction based on a gravitational acceleration direction.

FIG. 1 is a cross-sectional view illustrating a plasma etching apparatus according to an embodiment. A plasma etching apparatus 1 illustrated in FIG. 1 is a reactive ion etching (RIE) apparatus of capacitive coupling type (parallel plate type). The plasma etching apparatus 1 includes a chamber 2, an exhaust port 3, a process gas introduction port 4, a lower electrode (substrate electrode) 5, an upper electrode (counter electrode) 6, a first process gas introduction system 7, a second process gas introduction system 8, a first power supply system 9, and a second power supply system 10.

The chamber 2 is provided with the exhaust port 3 and the process gas introduction port 4. The exhaust port 3 is connected to not-illustrated pressure regulating valve, exhaust pump, and so on. A gas in the chamber 2 is exhausted from the exhaust port 3, resulting in that the inside of the chamber 2 is maintained in a high vacuum. When introducing a process gas from the process gas introduction port 4, a flow rate of the gas that flows from the process gas introduction port 4 is balanced with a flow rate of the gas that flows out of the exhaust port 3, and thereby, the pressure inside the chamber 2 can be maintained to a constant vacuum pressure.

To the process gas introduction port 4 in the chamber 2, the first process gas introduction system 7 and the second process gas introduction system 8 are connected. Further, the chamber 2 is provided with a gas introduction space 12 facing a plurality of gas discharge ports 11 of the upper electrode 6, in a manner that the gas introduction space 12 is connected to the process gas introduction port 4. The first process gas introduction system 7 has a mechanism of vaporizing a process gas raw material in a liquid state or solid state at room temperature and introducing the vaporized process gas raw material into the chamber 2. The second process gas introduction system 8 is to introduce a process gas in a gaseous state at room temperature into the chamber 2, and includes a gas supply source 13, a mass flow controller 14 that controls a gas flow rate, an opening/closing valve 15, and a pipe 16. One end of the pipe 16 is connected to the gas supply source 13, and the other end of the pipe 16 is connected to the process gas introduction port 4. As the process gas in a gaseous state at room temperature, there are used a rare gas such as He, Ar, Kr, or Xe, a gas such as $N_2$, $O_2$, $H_2$, CO, $CH_4$, $NF_3$, or $SF_6$, a general CF (fluorocarbon)-based gas such as $CF_4$, $C_4F_6$, or $C_4F_8$, and a general CHF (hydrofluorocarbon)-based gas such as $CHF_3$, $CH_2F_2$, or $CH_3F$.

The first process gas introduction system 7 includes a raw material tank 17 that accommodates a liquid process gas raw material GS, a liquid flow rate controller 18, a vaporizer 19 that vaporizes the liquid process gas raw material GS, and a pipe 20 that connects these raw material tank 17, liquid flow rate controller 18, and vaporizer 19. One end of the pipe 20 is opened to the inside of the raw material tank 17, and the other end of the pipe 20 is connected to the process gas introduction port 4. To the raw material tank 17, an inert gas supply line 21 is connected. To the vaporizer 19, there is connected a carrier gas supply line 22 that supplies a carrier gas for feeding a vaporized component of the process gas raw material GS (process gas) into the chamber 2. A periphery of the vaporizer 19 is covered by a heat insulating material 23. Further, in order to prevent the vaporized component of the process gas raw material GS from liquefying in the pipe 20, a heater 24 is provided in a periphery of the pipe 20 from the vaporizer 19 to the process gas introduction port 4. Each of the pipe 20, the inert gas supply line 21, and the carrier gas supply line 22 is provided with an opening/closing valve 25 according to a desired place.

In the first process gas introduction system 7, an inert gas is supplied from the inert gas supply line 21 to the raw material tank 17, and thereby, the process gas raw material GS is fed to the vaporizer 19 via the liquid flow rate controller 18. The liquid process gas raw material GS, whose flow rate has been controlled by the liquid flow rate controller 18, is vaporized by the vaporizer 19. Since the flow rate of the liquid process gas raw material GS is controlled by the liquid flow rate controller 18, the vaporized component of the process gas raw material GS vaporized by the vaporizer 19 is fed into the chamber 2 via the process gas introduction port 4, at a predetermined gas flow rate. The liquid process gas raw material GS and the vaporized component thereof will be described in detail later.

Figure 2:
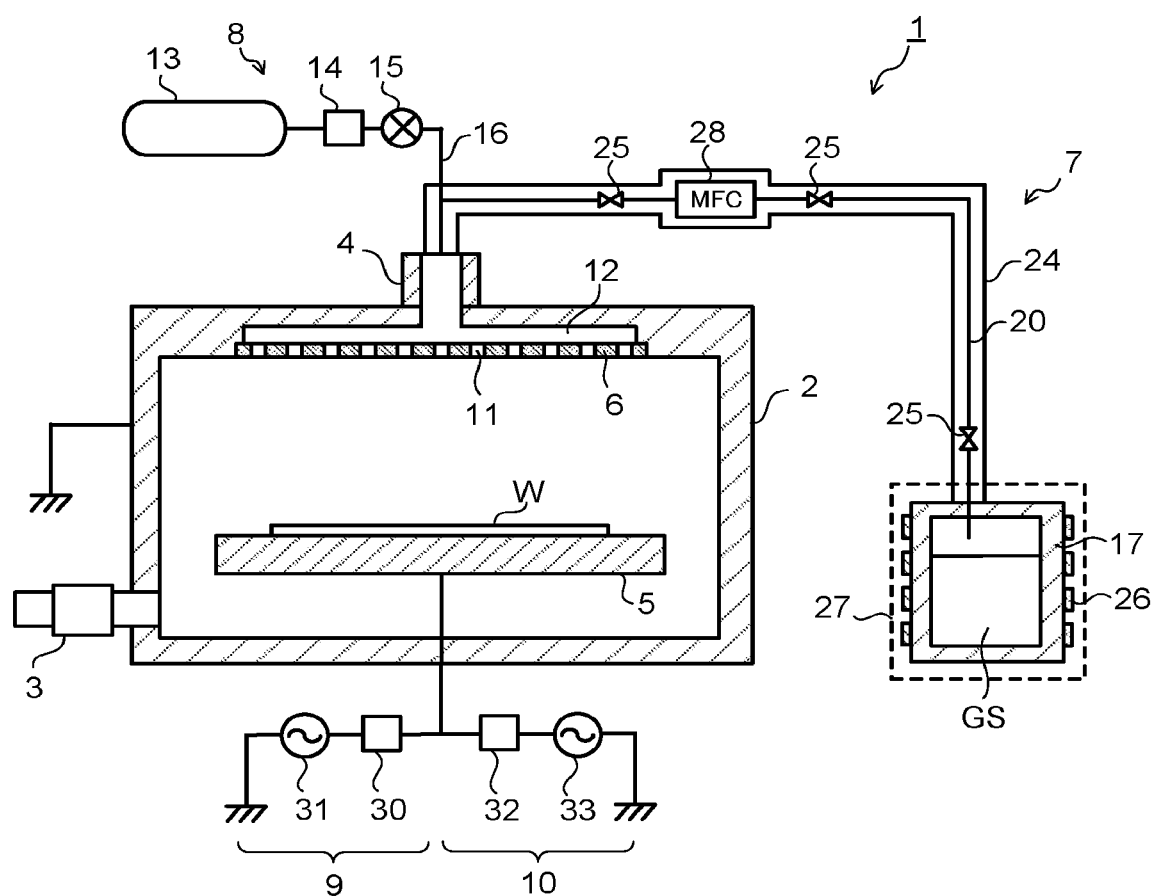
FIG. 2 is a cross-sectional view illustrating a modified example of the plasma etching apparatus in the embodiment.

The mechanism of vaporizing the process gas raw material GS is not limited to the configuration using the vaporizer 19 illustrated in FIG. 1. FIG. 2 illustrates a modified example of the plasma etching apparatus in the embodiment. As illustrated in FIG. 2, the plasma etching apparatus may have a vaporization mechanism that vaporizes the liquid or solid process gas raw material GS by directly heating the raw material tank 17 in which the liquid or solid process gas raw material GS is accommodated. In the first process gas introduction system 7 illustrated in FIG. 2, a first heater 26 is provided in a periphery of the raw material tank 17 in which the liquid or solid process gas raw material GS is accommodated, and a periphery of the raw material tank 17 and the first heater 26 is covered by a heat insulating material 27. In the pipe 20 from the raw material tank 17 to the process gas introduction port 4, a gas flow rate controller 28 is provided. A second heater 24 is provided in a periphery of the pipe 20 and the gas flow rate controller 28.

In the first process gas introduction system 7 illustrated in FIG. 2, the raw material tank 17 in which the liquid or solid process gas raw material GS is accommodated is directly heated by the heater 26. The liquid or solid process gas raw material GS heated by the heater 26 is vaporized, and a resulting vaporized component is fed to the pipe 20. A flow rate of the vaporized component of the process gas raw material GS is controlled by the gas flow rate controller 28, and the vaporized component is fed in this state into the chamber 2 via the process gas introduction port 4.

In the chamber 2, the lower electrode 5 is provided as a substrate electrode that is vertically movable and also functions as a mounting table (holding part) on which a substrate such as a semiconductor wafer W is to be mounted. On an upper portion of the lower electrode 5, a not-illustrated electrostatic chuck is provided, so that the semiconductor wafer W can be held on the lower electrode 5. Above the lower electrode 5, the upper electrode 6 that also functions as a shower head for process gas discharge is placed, as a counter electrode, at a position separating the gas introduction space 12 from a processing space where etching of the semiconductor wafer W is performed. The upper electrode 6 is provided with a plurality of the gas discharge ports 11 to supply the process gas from the gas introduction space 12 to the processing space of the semiconductor wafer W. The chamber 2 is grounded.

To the lower electrode 5 as the substrate electrode, the first power supply system 9 and the second power supply system 10 are connected. The first power supply system 9 includes a matching device 30 and a first high-frequency power supply 31, and the second power supply system 10 includes a matching device 32 and a second high-frequency power supply 33. The first high-frequency power supply 31 is a power supply that outputs a first high-frequency voltage (Va) for ionizing the process gas to generate plasma, and the output first high-frequency voltage (Va) is applied to the lower electrode 5. The second high-frequency power supply 33 is a power supply that outputs a second high-frequency voltage (Vb) for attracting ions to the semiconductor wafer W from plasma, a frequency of the second high-frequency voltage (Vb) being lower than that of the first high-frequency voltage (Va), and the output second high-frequency voltage (Vb) is applied to the lower electrode 5. Both the voltage Va and the voltage Vb are generally referred to as high-frequency voltages, but in order to explain a difference between the respective frequencies, the first high-frequency voltage (Va) is referred to as an RF high-frequency voltage and the second high-frequency voltage (Vb) is referred to as an RF low-frequency voltage, for the sake of convenience.

The RF high-frequency voltage (Va) output by the first high-frequency power supply 31 is preferably 27 MHz or more for increasing power of generating plasma, and is preferably 100 MHz, 60 MHz, 40 MHz, 27 MHz, or the like. The RF low-frequency voltage (Vb) output by the second high-frequency power supply 33 is preferably 3 MHz or less for increasing ion attraction from plasma, and is preferably 3 MHz, 2 MHz, 400 kHz, 100 kHz, or the like. A voltage between an upper peak and a lower peak of the RF low-frequency voltage (Vb) that is applied from the second high-frequency power supply 33 to the lower electrode 5 is preferably 1000 V or more.

FIG. 1 and FIG. 2 each illustrate an example where the first power supply system 9 and the second power supply system 10 are connected to the lower electrode 5, but they may be connected to the upper electrode 6 instead of the lower electrode 5. The power supply systems may be connected to both the lower electrode 5 and the upper electrode 6 to enable application of a predetermined voltage.

At the same time as the process gas is introduced from the first process gas introduction system 7 into the chamber 2 and, if necessary, the process gas is introduced from the second process gas introduction system 8 into the chamber 2, the RF high-frequency voltage (Va) and the RF low-frequency voltage (Vb) are applied to the lower electrode 5 from the above-described first high-frequency power supply 31 and second high-frequency power supply 33, respectively, resulting in that plasma is generated between the lower electrode 5 and the upper electrode 6. As a result that the RF high-frequency voltage (Va) from the first high-frequency power supply 31 and the RF low-frequency voltage (Vb) from the second high-frequency power supply 33 are superposed and applied to the lower electrode 5, the process gas is ionized to form plasma of the process gas between the lower electrode 5 and the upper electrode 6, and simultaneously, ions are attracted toward the lower electrode 5 side.

Next, the plasma etching method of the semiconductor wafer W using the above-described plasma etching apparatus 1 will be explained. In a plasma etching method in an embodiment, a substrate such as the semiconductor wafer W, which is a workpiece for etching, is first mounted on the lower electrode 5. The semiconductor wafer W being a workpiece includes a silicon-containing film such as a silicon oxide film (SiO film), a silicon nitride film (SiN film), or a stacked film of a SiO film and a SiN film formed on a semiconductor film or a metal film that contains at least one selected from the group consisting of silicon, tungsten, aluminum, titanium, molybdenum, and tantalum.

An etching mask is formed on the semiconductor wafer W including the silicon-containing film such as a SiO film or a SiN film, and the etching mask is patterned to form an opening, and then plasma etching is performed, to thereby form a hole portion such as a contact hole in the silicon-containing film according to the opening of the etching mask. As the material of the mask used here, any well-known material that can be used for plasma etching can be used without limitation, and examples thereof include carbon, silicon, tungsten, and so on. The mask is preferably formed of a material having at least one or more of these materials.

When forming the contact hole or the like in the silicon-containing film, the process gas is introduced from the first process gas introduction system 7 into the chamber 2, and simultaneously, the RF high-frequency voltage (Va) and the RF low-frequency voltage (Vb) are applied from the first high-frequency power supply 31 and the second high-frequency power supply 33, respectively, to the lower electrode 5 on which the semiconductor wafer W with the etching mask formed thereon is mounted. By this operation, plasma is generated between the lower electrode 5 and the upper electrode 6, and simultaneously, ions in the plasma are attracted to the semiconductor wafer W, and thereby, the silicon-containing film is etched. The etching of the silicon-containing film is performed, for example, on the SiO film. The silicon-containing film to be etched is not limited to a single film of SiO film, but may also be a stacked film of a SiO film and a SiN film. In the etching of the silicon-containing film, the silicon-containing film can be processed selectively based on a difference in etching rate between the silicon-containing film and the above-described base semiconductor film or metal film.

In the plasma etching of the silicon-containing film described above, as the process gas raw material GS that is accommodated in the raw material tank 17 of the first process gas introduction system 7 in this embodiment, there is used hydrofluorocarbon having a composition represented by $C_xH_yF_z$ (where x, y, and z are positive integers satisfying x≥6 and (z–y)/x≤1) as a conjugated cyclic compound. The hydrofluorocarbon having the above-described composition (to be hereinafter referred to as conjugated cyclic hydrofluorocarbon) is a liquid or solid state at room temperature, and thus such a mechanism to vaporize the liquid or solid process gas raw material GS as illustrated in FIG. 1 and FIG. 2 is used.

The above-described conjugated cyclic hydrofluorocarbon has a structure that satisfies the composition of x≥6 and (z–y)/x≤1, which makes it possible to selectively etch the silicon-containing film and simultaneously form deposits on the mask, preventing thinning of the mask caused by etching. Fluorocarbon and hydrofluorocarbon, which can form such deposits, have been known, but the deposits generally deposit not only in the longitudinal direction but also in the lateral direction, which gradually narrows the opening and often prevents the desired etching from proceeding. In contrast to this, the conjugated cyclic hydrofluorocarbon in the embodiment can form sufficient deposits in the longitudinal direction and simultaneously inhibit the deposition in the lateral direction. Thus, using the conjugated cyclic hydrofluorocarbon in the embodiment makes it possible to inhibit the adverse effect on an etched shape because when it is deposited on the mask, it is less likely to block the opening of the mask.

As for deposition characteristics, when the ratio of the number of fluorine atoms to the number of carbon atoms (F/C ratio) is smaller in the hydrofluorocarbon as an etching gas, the attachment coefficient of CFx radicals, which are generated by plasmaization and contribute to the deposition, to the mask becomes higher. Further, a compound having a structure such as a C=C bond is thought to easily polymerize and deposit by a cross-linking reaction starting from the cleavage of a π-π* bond, and the more π bonds are introduced as a conjugated compound, the higher the deposition properties can be.

On the other hand, it is thought that if the attachment coefficient or ease of deposition is increased too much, as described above, the deposition in the lateral direction will also proceed and the opening will be more likely to be blocked. In contrast to this, the present inventors have found out that the deposition properties in the longitudinal direction can be significantly enhanced by containing hydrogen atoms in the compound as represented in the chemical formula in the above-described embodiment, in a manner to satisfy a predetermined relation with other elements. This is because the bond dissociation energy of the C—H bond (338.72 kJ/mol) is lower than the bond dissociation energy of the C—F bond (513 kJ/mol), resulting in a decrease in etching resistance of the deposit. This is thought to be because it makes it easier to remove the deposits in the lateral direction with a small amount of attached radicals.

As described above, the deposition properties of each compound change due to various factors, but the conjugated cyclic hydrofluorocarbon in the embodiment can enhance the deposition characteristic by having a conjugated cyclic structure with a small F/C ratio in response to the decrease in etching resistance of the deposit obtained by the introduction of hydrogen atoms. By balancing these, unprecedentedly good deposition properties are obtained and excellent etching characteristics are exhibited. Therefore, when etching the silicon-containing film such as a silicon oxide film (SiO) formed on the semiconductor wafer W, the processing selection ratio between the film to be processed and the etching mask can be increased.

Hereinafter, the conjugated cyclic hydrofluorocarbon $C_xH_yF_z$ (where x, y, and z are positive integers satisfying x≥6 and (z–y)/x≤1) will be explained more specifically. The conjugated cyclic hydrofluorocarbon has a conjugated cyclic structure in order to achieve the desired processing selectivity with the etching mask and etching rate as described above. By having the conjugated cyclic structure, adjustment of the above-described F/C ratio and stable introduction of a large amount of π-bonds can be achieved. Among compounds, a compound having aromaticity as the conjugated cyclic structure (for example, a compound having a benzene ring) is preferred because the stability of the compound itself increases to make it easier to maintain the composition of a mother gas to some extent, thus enabling stable formation of deposits.

As the conjugated cyclic hydrofluorocarbon having a composition represented by $C_xH_yF_z$ (where x, y, and z are positive integers satisfying x≥6 and (z–y)/x≤1), there can be cited, for example, $C_6HF_5$, $C_7HF_7$, $C_7H_2F_6$, $C_7H_3F_5$, $C_8HF_9$, $C_8HF_7$, $C_9HF_9$, $C_9H_2F_8$, and so on.

Figure 3:
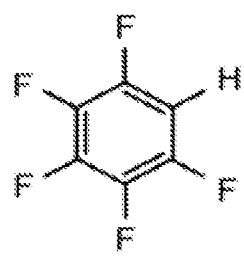
FIG. 3 is a view illustrating examples of hydrofluorocarbon gases used in a plasma etching method in an embodiment.
Figure 3:
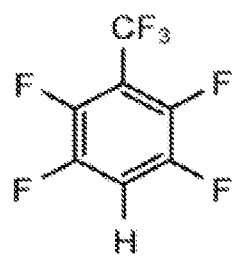
Figure 3:
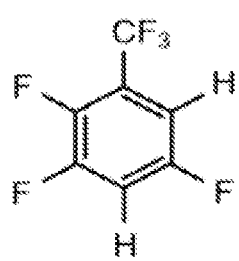
Figure 3:
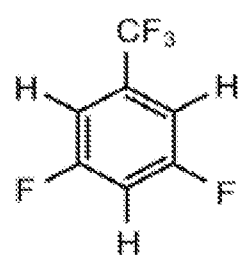
Figure 3:
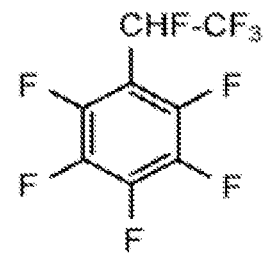
Figure 3:
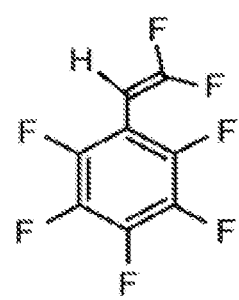
Figure 3:
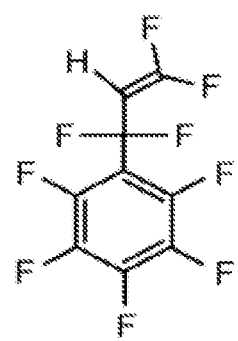
Figure 3:
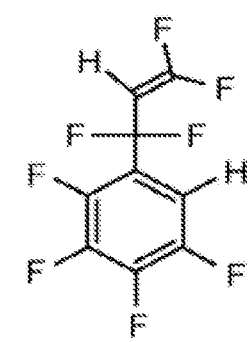

FIG. 3 illustrate structural examples of the above-described conjugated cyclic hydrofluorocarbon. As illustrated in FIG. 3, each structural example has a benzene ring structure, and a hydrogen atom is bonded to the benzene ring or introduced into its fluorinated substituent. The structures illustrated in FIG. 3 are examples, and when a plurality of structural isomers can be obtained depending on the position where a hydrogen atom is introduced, any of the structural isomers may be used. In such structural isomers, there is almost no difference in the above-described functions and effects during etching between the case where the hydrogen atom is bonded directly to the benzene ring and the case where the hydrogen atom is bonded to the side chain.

Thus, the process gas to be introduced into the chamber 2 from the first process gas introduction system 7 preferably contains at least one selected from the group consisting of a $C_6HF_5$ gas, a $C_7HF_7$ gas, a $C_7H_2F_6$ gas, a $C_7H_3F_5$ gas, a $C_8HF_9$ gas, a $C_8HF_7$ gas, a $C_9HF_9$ gas, and a $C_9H_2F_8$ gas.

Figure 4:
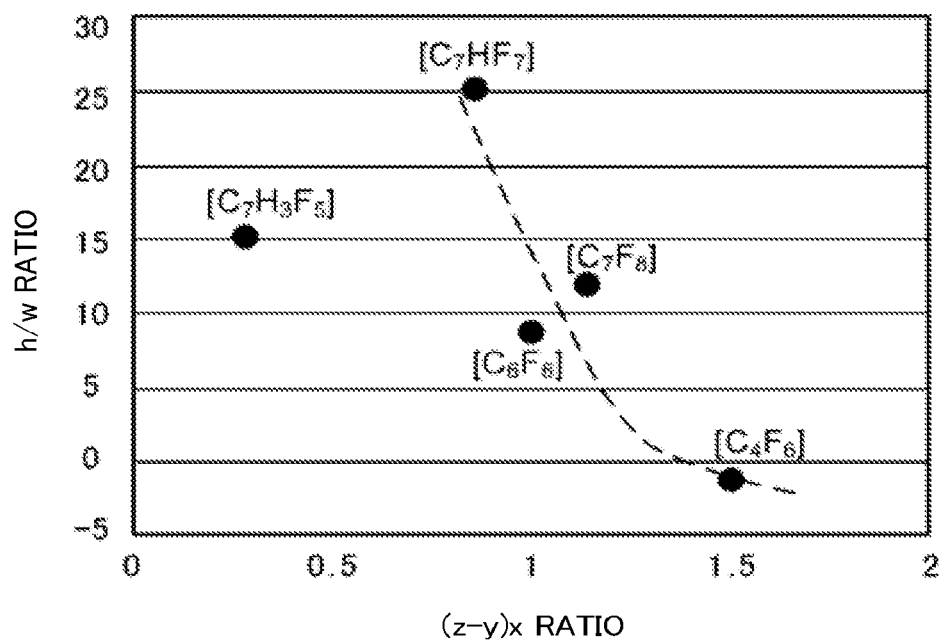
FIG. 4 is a chart illustrating one example of the relationship of a height-width ratio (h/w ratio) of deposit to an atomic number ratio ((z−y)/x ratio) of each element of the hydrofluorocarbon gas used in the plasma etching method.
Figure 5:
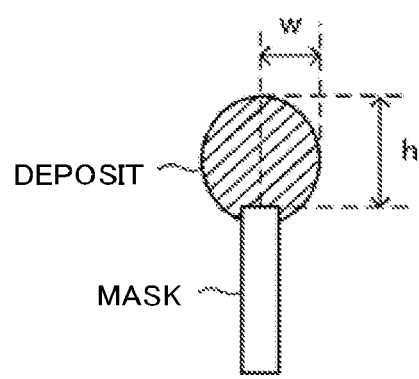
FIG. 5 is a view for explaining an aspect ratio of the deposit in FIG. 4.

FIG. 4 illustrates one example of the deposition properties in the longitudinal direction with respect to an atomic number ratio of each element of the conjugated cyclic hydrofluorocarbon. FIG. 4 illustrates the relationship between [the (z-y)/x ratio] and (the h/w ratio) (deposition properties). The h/w ratio is the ratio of the height (h) to the width (w) of the deposit deposited on the mask, and a conceptual diagram of its calculation is illustrated in FIG. 5. The width (w) is the maximum length (width) of the deposit deposited laterally from the center of the mask. The height (h) is the length (height) of the deposit deposited upward from the top of the mask.

FIG. 4 illustrates, as one example of the conjugated cyclic hydrofluorocarbon, characteristics of $C_7HF_7$ gas and $C_7H_3F_5$ gas as examples. FIG. 4 also illustrates characteristics of $C_4F_6$ gas, $C_6F_6$ gas, and $C_7F_8$ gas for comparison.

As illustrated in FIG. 4, the hydrofluorocarbon gas composed of the vaporized component of the conjugated cyclic hydrofluorocarbon has good deposition properties in its longitudinal direction and can increase the processing selection ratio between the film to be processed and the etching mask. Thus, according to the embodiment, a contact hole with a large aspect ratio or the like can be formed in the SiO film or the stacked film of a SiO film and a SiN film, for example.

As the ratio of hydrogen atoms in the conjugated cyclic hydrofluorocarbon increases, the etching rate of the silicon-containing film such as $SiO_2$ becomes slower, and thus, the hydrofluorocarbon preferably contains more number of fluorine atom than that of hydrogen atom (z>y).

Further, as the ratio of hydrogen atoms in the conjugated cyclic hydrofluorocarbon increases, the h/w ratio tends to decrease. In terms of the relation of atomic numbers of each element of the conjugated cyclic hydrofluorocarbon $(C_xH_yF_z)$, $1/3 \leq (z-y)/x \leq 1$ is preferable, $1/2 \leq (z-y)/x \leq 1$ is more preferable, and $2/3 \leq (z-y)/x \leq 1$ is further preferable. The number of hydrogen atoms y satisfies such relations, thereby making it possible to improve the deposition properties in the longitudinal direction. For example, the number of hydrogen atoms to be contained in the compound may be one.

Note that the configurations of the aforementioned respective embodiments can be mutually combined to be carried out, and a part thereof can be substituted. Here, while certain embodiments of the present invention have been described, these embodiments have been presented by way of example only, and are not intended to limit the scope of the inventions. The novel embodiments described herein may be embodied in a variety of other forms; furthermore, various omissions, substitutions, changes, and so on may be made therein without departing from the spirit of the inventions. The accompanying claims and their equivalents are intended to cover such forms or modifications as would fall within the scope and spirit of the inventions.

What is claimed is:

1. A plasma etching method, comprising:
etching a silicon-comprising film by using plasma of a hydrofluorocarbon gas,
wherein the hydrofluorocarbon gas comprises

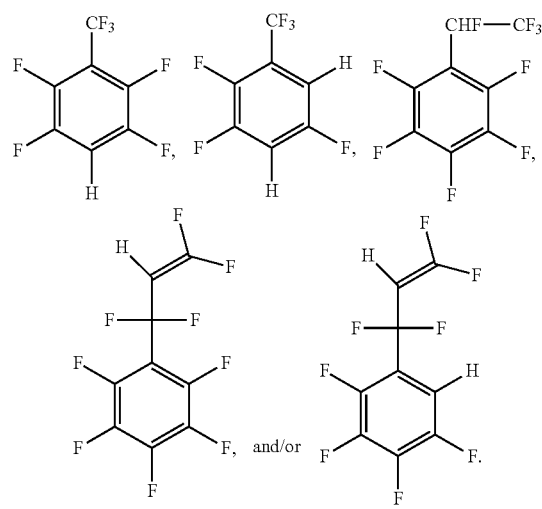

2. The method of claim 1, wherein the silicon-comprising film comprises a silicon oxide film and/or a silicon nitride film.

3. The method of claim 1, further comprising:
vaporizing a liquid or solid raw material comprising the hydrofluorocarbon to obtain a vaporized component of the hydrofluorocarbon; and
generating the plasma of the hydrofluorocarbon gas that comprises the vaporized component of the hydrofluorocarbon.

4. The method of claim 1, wherein the silicon-comprising film comprises a silicon oxide film provided above a semiconductor substrate, and
wherein the etching the silicon-comprising film comprises: forming an etching mask having an opening on the silicon-comprising film; and forming a hole according to the opening in the silicon-comprising film by using the plasma of the hydrofluorocarbon gas generated in a chamber.

5. The method of claim 4, wherein the plasma is generated by applying a high-frequency voltage between a first electrode which is arranged in the chamber and on which the semiconductor substrate is mounted, and a second electrode arranged in the chamber so as to face the first electrode.

6. The method of claim 1, wherein the hydrofluorocarbon gas has a structure comprising a hydrogen atom on a substituent of the benzene ring.

7. The method of claim 1, wherein the silicon-comprising film comprises, stacked, a silicon oxide film and a silicon nitride film.

8. The method of claim 1, wherein the silicon-comprising film comprises a silicon oxide film and a silicon nitride film, stacked and provided above a semiconductor substrate, and
wherein the etching the silicon-comprising film comprises: forming an etching mask having an opening on the silicon-comprising film; and forming a hole according to the opening in the silicon-comprising film by using the plasma of the hydrofluorocarbon gas generated in a chamber.

9. The method of claim 8, wherein the plasma is generated by applying a high-frequency voltage between a first electrode which is arranged in the chamber and on which the semiconductor substrate is mounted, and a second electrode arranged in the chamber so as to face the first electrode.

10. The method of claim 1, wherein the hydrofluorocarbon gas comprises

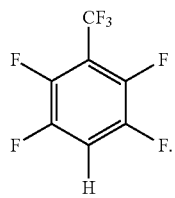

11. The method of claim 1, wherein the hydrofluorocarbon gas comprises

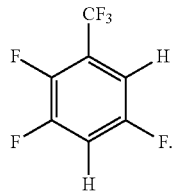

12. The method of claim 1, wherein the hydrofluorocarbon gas comprises

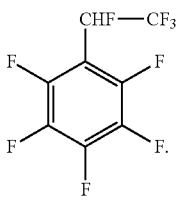

13. The method of claim 1, wherein the hydrofluorocarbon gas comprises

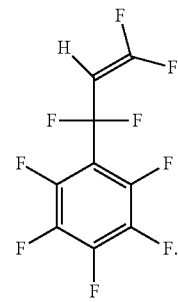 [SMILES: FC(F)=CC(F)(F)c1c(F)c(F)c(F)c(F)c1F]

14. The method of claim 1, wherein the hydrofluorocarbon gas comprises

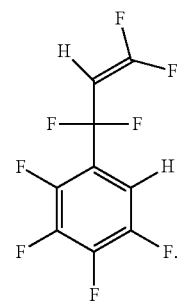 [SMILES: FC(F)=CC(F)(F)c1cc(F)c(F)c(F)c1F]

15. The method of claim 1, wherein the silicon-comprising film comprises, stacked, a silicon oxide film and a silicon nitride film.

16. A plasma etching method, comprising:
etching a silicon-comprising film by using plasma of a hydrofluorocarbon gas,
the hydrofluorocarbon gas comprises a benzene ring
and is a compound of formula $C_6HF_5$, $C_7HF_7$, $C_7H_2F_6$, $C_8HF_9$, $C_8HF_7$, $C_9HF_9$, and/or $C_9H_2F_8$, and
wherein an h/w ratio of height, as h, to a width, as w, of a deposit deposited on a mask is greater than 10, the width being a maximum a first dimension of the deposit deposited laterally from a center of the mask, and the height being a second dimension of the deposit deposited upward from a top of the mask.

17. The method of claim 16, wherein the silicon-comprising film comprises a silicon oxide film and/or a silicon nitride film.

18. The method of claim 16, wherein the compound in the hydrofluorocarbon gas has a structure comprising a hydrogen atom bonded to a benzene ring.

* * * * *